United States Patent
Rauf et al.

(10) Patent No.: US 7,335,602 B2
(45) Date of Patent: Feb. 26, 2008

(54) CHARGE-FREE LAYER BY LAYER ETCHING OF DIELECTRICS

(75) Inventors: Shahid Rauf, Pflugerville, TX (US); Peter L. G. Ventzek, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 7 days.

(21) Appl. No.: 11/333,844

(22) Filed: Jan. 18, 2006

(65) Prior Publication Data

US 2007/0163994 A1 Jul. 19, 2007

(51) Int. Cl.
*H01L 21/302* (2006.01)

(52) U.S. Cl. .................. 438/714; 438/10; 438/706; 438/710

(58) Field of Classification Search .......... 438/706, 438/710, 712, 714, 6, 10
See application file for complete search history.

(56) References Cited

U.S. PATENT DOCUMENTS

| | | | |
|---|---|---|---|
| 5,328,558 A | | 7/1994 | Kawamura |
| 5,385,651 A | | 1/1995 | Stickney et al. |
| 6,399,511 B2 * | | 6/2002 | Tang et al. ............. 438/714 |
| 6,635,185 B2 * | | 10/2003 | Demmin et al. ............. 216/64 |
| 2002/0160125 A1 * | | 10/2002 | Johnson et al. ............. 427/569 |
| 2004/0244687 A1 * | | 12/2004 | Ichiki et al. ............. 118/723 E |

FOREIGN PATENT DOCUMENTS

EP 0 746 014 B1 9/2002

\* cited by examiner

*Primary Examiner*—Lan Vinh
(74) *Attorney, Agent, or Firm*—John A. Fortkart; Fortkart & Houston P.C.

(57) ABSTRACT

A method for etching a dielectric film is provided herein. In accordance with the method, a device (201) is provided which comprises a first chamber (203) equipped with a first gas supply (209) and a second chamber (205) equipped with a second gas supply (215), wherein the second chamber is in communication with the first chamber by way of an acceleration grid (211) having a variable potential. The gas flow into the plasma chamber is oscillated between a first state in which the gas flow into the first chamber has the composition $f_{11}$ and the gas flow into the second chamber has the composition $f_{21}$, and a second state in which the gas flow into the first chamber has the composition $f_{12}$ and the gas flow into the second chamber has the composition $f_{22}$. The potential applied to the acceleration grid is oscillated such that the voltage applied to the grid is $V_1$ when the gas flow into the plasma chamber is in the first state, and the voltage applied to the grid is $V_2$ when the gas flow into the plasma chamber is in the second state.

17 Claims, 5 Drawing Sheets

CHARGE-FREE LAYER BY LAYER ETCHING OF DIELECTRICS

FIELD OF THE DISCLOSURE

The present disclosure relates generally to methods for etching substrates, and more particularly to methods for etching substrates with plasmas.

BACKGROUND OF THE DISCLOSURE

In conventional plasma etching processes, charged plasma species, such as ions, and neutral radical plasma species, such as chlorine atoms, are used to bombard a substrate. This process is often mediated by a layer formed on the substrate that comprises both incident and substrate species. If the resulting reaction byproducts are volatile, such processes are capable of etching substrates in a fairly rapid manner.

However, the speed of conventional plasma etching processes comes at the expense of precision, which is manifested as feature distortion in the resulting product. Such feature distortion has a negative impact on product performance and product yield. Product yield is further adversely affected by etch speed non-uniformity across the wafer, especially at faster etch rates.

In the past, the amount of feature distortion attendant to plasma etching was somewhat negligible relative to the typical dimensions of feature sizes. However, as feature sizes have begun to approach 20-30 nm or smaller, such distortion has become increasingly significant, and indeed has emerged as a limitation to the feature sizes attainable with plasma etching. The limitations on precision attainable with conventional plasma etching processes have been further highlighted by the emerging need in the industry to process very small features on very large substrates (e.g., on wafers with diameters of 300 mm diameter or larger), which tends to magnify any loss of precision due to any non-uniformities in large area plasmas.

Atomic layer etching represents the other extreme of known etching processes. In a typical embodiment of such a process, a monolayer of chlorine is deposited on a substrate using chlorine or a chlorine-containing plasma. The monolayer of chlorine may then be bombarded with ions to etch away this layer along with a single monatomic layer of the underlying substrate. This process is repeated many times until the desired feature dimensions have been attained. Since the substrate is etched one monolayer at a time, the precision attainable with this process is extremely high.

Unfortunately, the remarkable precision afforded by atomic layer etching comes at the expense of speed. In particular, since atomic layer etching removes unwanted portions of the substrate at the rate of mere angstroms per etch, and since current features sizes are on the order of nanometers, the use of such a process to achieve typical feature sizes requires a large number of deposition/etch cycles. Consequently, the amount of time required to achieve feature definition by atomic layer etching in current technology nodes is frequently on the order of several hours, making it unsuitable for commercial implementation.

There is thus a need in the art for an etching process that exhibits better precision than conventional plasma etching processes, that is self-limiting (to accommodate any spatial non-uniformity associated with processing over very large substrates), and that offers faster etch rates than conventional atomic layer deposition. These and other needs may be met by the devices and methodologies described herein.

DETAILED DESCRIPTION

Figure 1:
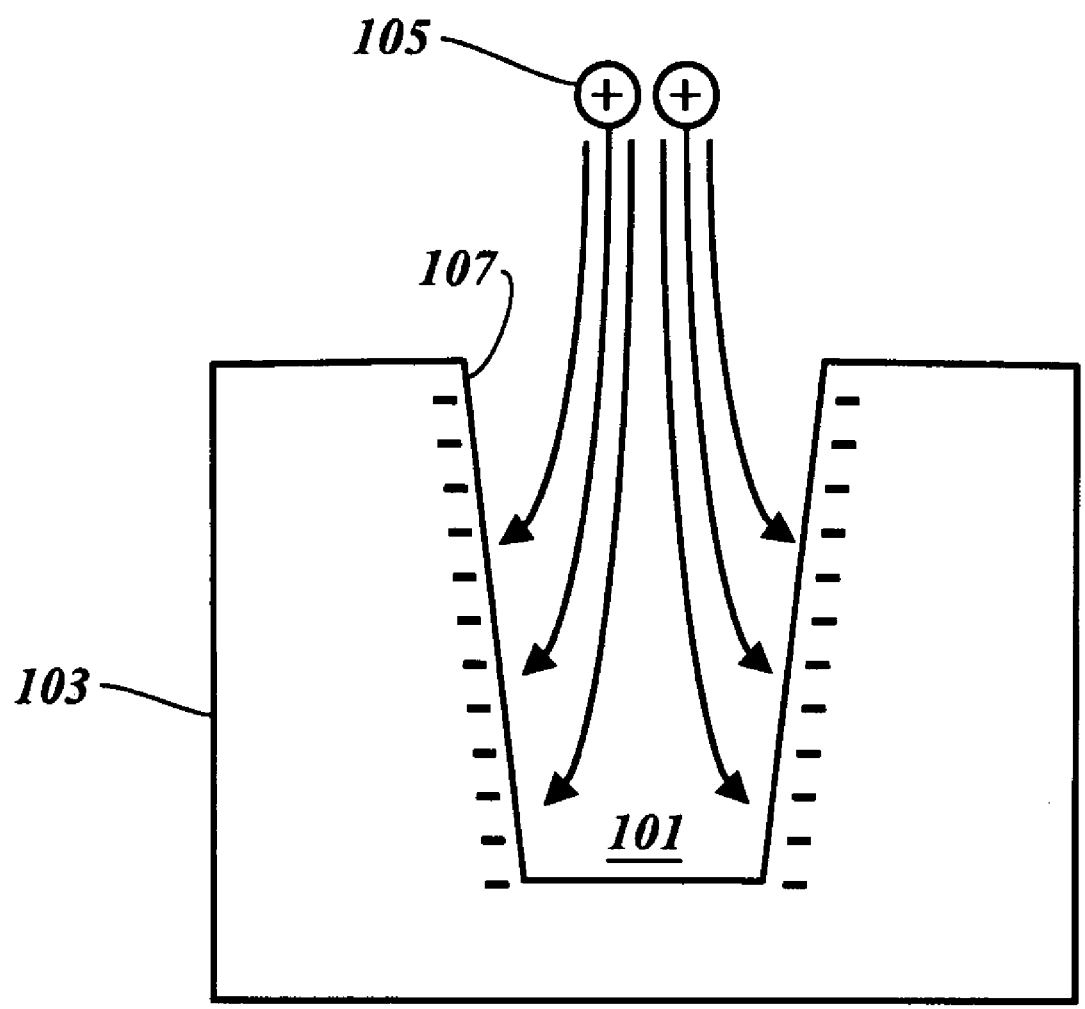
FIG. 1 is an illustration of charged species trajectory distortion in a prior art plasma etching process.

In one aspect, a method for etching a substrate is provided. In accordance with the method, a film is deposited on a material by impinging the material with a first neutral molecular species. The material is then etched by impinging the film with a second species.

In another aspect, a method for etching a dielectric film is provided herein. In accordance with the method, a plasma chamber is provided which is equipped with a first gas supply. A neutralization chamber is also provided which is equipped with a second gas supply, and which is in communication with the plasma chamber by way of an acceleration grid. The gas flow into the plasma chamber and neutralization chamber is oscillated between a first state in which the gas flow into the plasma chamber has the composition $f_{11}$ and the gas flow into the neutralization chamber has the composition $f_{21}$, and a second state in which the gas flow into the plasma chamber has the composition $f_{12}$ and the gas flow into the neutralization chamber has the composition $f_{22}$. The potential applied to the acceleration grid is oscillated such that the voltage applied to the grid is $V_1$ when the gas flow into the plasma chamber is in the first state, and the voltage applied to the grid is $V_2$ when the gas flow into the plasma chamber is in the second state.

In a further aspect, an apparatus for etching a substrate is provided. The apparatus comprises (a) an acceleration grid having a variable potential, (b) a first chamber equipped with a first gas supply and being adapted to generate a plasma, (c) a second chamber equipped with a second gas supply, wherein the second chamber is in communication with the first chamber by way of said acceleration grid, (d) a first oscillator adapted to oscillate the gas flow into the plasma chamber between a first state in which the gas flow into the first chamber has the composition $f_{11}$ and the gas flow into the second chamber has the composition $f_{21}$, and a second state in which the gas flow into the first chamber has the composition $f_{12}$ and the gas flow into the second chamber has the composition $f_{22}$, and (e) a second oscillator adapted to oscillate the potential applied to the acceleration grid such that the voltage applied to the grid is $V_1$ when the gas flow into the plasma chamber is in the first state, and the voltage applied to the grid is $V_2$ when the gas flow into the plasma chamber is in the second state.

These and other aspects of the present disclosure are described in greater detail below.

It has now been found that the aforementioned problems may be overcome by using energetic neutral molecular species, such as neutral radical molecular species, in a step-by-step plasma etch process (that is, in an etch process featuring repeated deposition/etch cycles). Without wishing to be bound by theory, it is believed that one major cause for the loss of precision in plasma etching processes is ion trajectory distortion resulting from charge build-up on a substrate being etched. It is further believed that the use of neutral species in the process described herein reduces or eliminates ion trajectory distortion, since the neutral species are unaffected by charge build-up. Consequently, the processes described herein afford greater precision than conventional plasma etch techniques. Precision is further enhanced by the fact that both the deposition and etch phases of the stepwise deposition/etch process can be made to be self-limiting, thereby affording greater control over the material being etched. The self-limiting nature of the described layer-by-layer etch process also eliminates loss of precision arising from the non-uniformity of large area plasmas.

On the other hand, since the process described herein utilizes molecular species such as $CF_2$ or $CF_3$ radicals during the deposition phase, it is inherently capable of depositing larger amounts of fluorine on a substrate than the monatomic layer of fluorine characteristic of atomic layer etching. Consequently, the amount of substrate removable in a single etch step is significantly larger. Hence, the etch rates attainable with this process are much larger than the rates of conventional atomic layer etch processes, thus making this process more suitable for current technology nodes in commercial semiconductor fabrication processes. While the process described herein has many uses, it is especially useful for etching dielectric substrates such as $SiO_2$ and $Si_3N_4$.

The reason for ion trajectory distortion and the attendant loss of precision in conventional plasma etching processes may be further understood with respect to FIG. 1, which depicts a trench 101 being formed in a semiconductor substrate 103 with a plasma source 105. As shown therein, during the etch process, charge build-up occurs on the sidewalls 107 of the trench 101 as it is being formed. This charge build-up, and the associated electrical attraction or repulsion, distorts the trajectory of the charged plasma species utilized in the etch process, as indicated by the arrows. Consequently, the shape of the etch profile tends to change over the course of the etch process.

The amount of charge build-up that accompanies plasma etching typically varies with feature size and pitch, and hence degrades feature resolution. In the past, the amount of feature distortion caused by charge build-up was negligible relative to the typical dimensions of feature sizes. However, as feature sizes have begun to approach 20-30 nm or smaller, such distortion has become increasingly significant, and indeed has emerged as a limitation to the feature sizes attainable with plasma etching. The collimated nature of neutral beams used in the etch process described herein eliminates etch rate variation with feature size and pitch, thus avoiding degradation of feature resolution.

Figure 2:
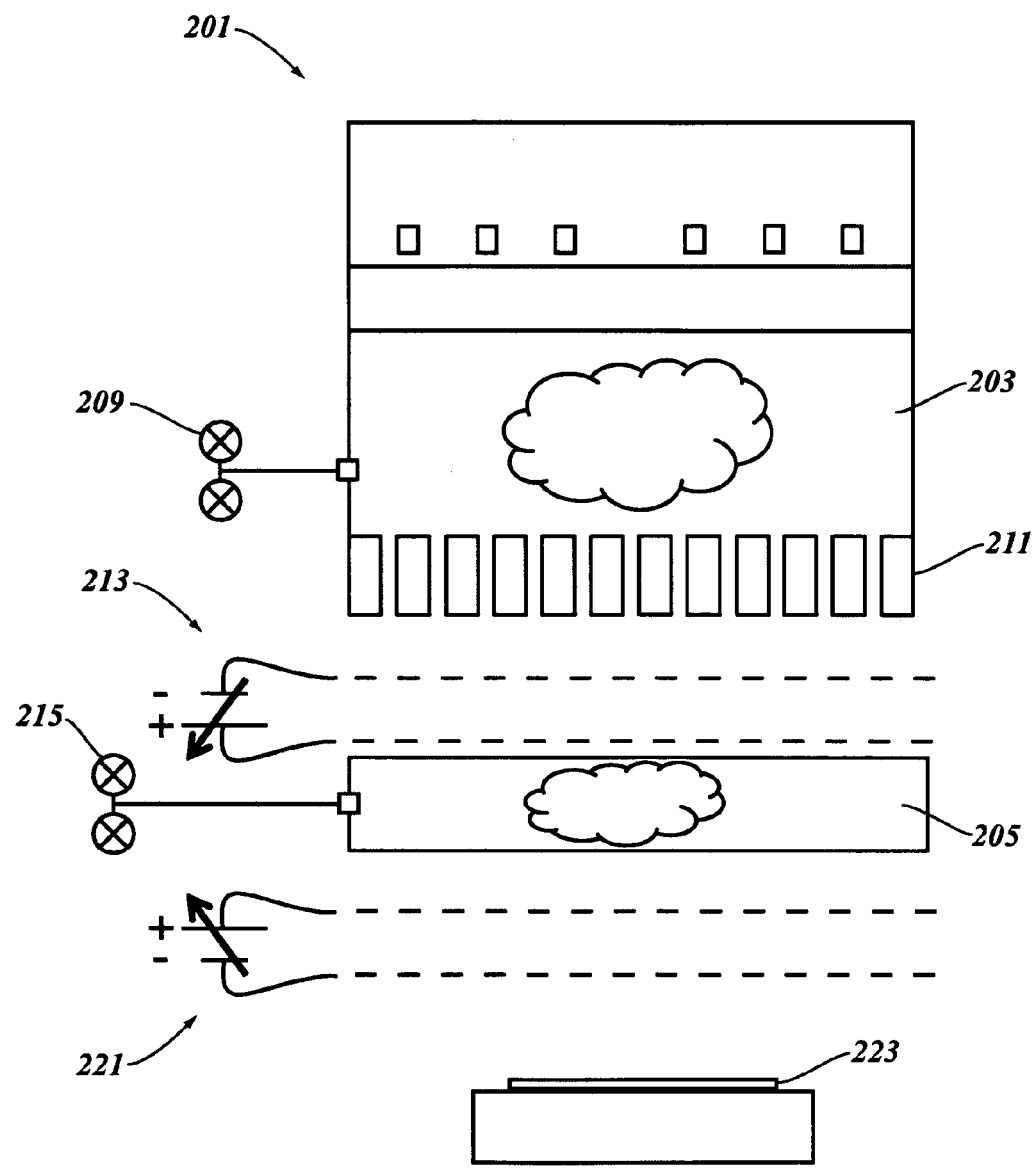
FIG. 2 is an illustration of a plasma reactor and neutralization chamber suitable for use in some of the methodologies taught herein.

FIG. 2 depicts one particular, non-limiting embodiment of an apparatus that may be used to etch a substrate in accordance with the teachings herein. The etch is conducted in a stepwise manner that is characterized by repeated deposition/etch cycles. The apparatus 201 features a plasma chamber 203 and a neutralization chamber 205. The plasma chamber 203 in this particular embodiment is a high density plasma chamber equipped with a gas flow 209 that is capable of being oscillated between a passivation gas flow of a material such as $C_2F_4$ or $C_4F_8$ (during the deposition phase of the cycle), and an etch gas flow of a material such as Ar, Kr, Xe, Ne or He (during the etch phase of the cycle). Preferably, if w and x are the respective flow rates of the passivation gas and the etch gas, and if $f_{11}(w,x)$ and $f_{12}(w,x)$ are the compositions of the gas flows in the plasma chamber 203 during the deposition and etch phases of the cycle, then $f_{11}(w, x)=f_{11}(w,0)$ and $f_{12}(w,x)=f_{12}(0,x)$.

The neutralization chamber 205 is likewise equipped with a gas flow 215 that is capable of being oscillated between a first neutralization gas flow of a material such as $C_2F_6$ (during the deposition phase of the cycle), and a second neutralization gas flow of a material such as $CO_2$ or $SO_2$ (during the etch phase of the cycle). Preferably, if y and z are the respective flow rates of the first neutralization gas and the second neutralization gas, and if $f_{21}(y,z)$ and $f_{22}(y,z)$ are the total gas flows in the neutralization chamber 205 during the deposition and etch phases of the cycle, then $f_{21}(y,z)=f_{21}(y,0)$ and $f_{22}(y,Z)=f_{22}(0,z)$.

As is described in greater detail below, the plasma chamber 203 generates energetic charged species or ions, and the neutralization chamber 205 converts these ions into neutral radical species. During the deposition phase of the deposition/etch cycle, these neutral radical species are film forming radicals, such as $CF_2$ radicals, that are impinged upon the substrate to form a passivation film. During the etch phase of the deposition/etch cycle, these neutral radical species are etching radicals, such as Ar radicals, that are impinged upon the substrate to remove the passivation film and an underlying portion of the substrate through sputtering.

Referring again to FIG. 2, after the energetic ions are generated in the plasma chamber 203, a beam of these ions is extracted from the high density plasma by way of an ion extraction grid 211. The ion extraction grid 211 is essentially a perforated electrode in which the dimensions of the perforations are chosen such that neutral species will be deflected from the electrode, and hence will not be extracted. The plasma sheath that forms within the plasma chamber 203 provides the necessary energy to accelerate ions through the ion extraction grid 211.

The neutralization chamber 205 contains a first pair of energy adjustment grids 213 or electrodes that are biased at a potential and that can be used to adjust the energy of ions entering the neutralization chamber 205 from the ion extraction grid 211. The neutralization chamber 205 is also equipped with a gas flow 215 that provides a population of neutral species within the chamber. As ions enter the neutralization chamber 205, they collide with these neutral species. The collision induces a charge exchange reaction by which the ions are converted into neutral species, and the resident neutral species are converted into charged species. However, since the ions entering the neutralization chamber retain all or most of their kinetic energy after they are neutralized, the neutralization process results in the generation of energetic neutral species. These energetic neutral species exit the neutralization chamber 205 by way of a second pair of energy adjustment grids 221. The second pair of energy adjustment grids 221 are properly polarized to repel charged species as they approach the exit of the neutralization chamber 205, and hence prevent such species from impinging the substrate 223.

In some embodiments, the collision between ions and neutral species within the neutralization chamber 205 will be accompanied by bond cleavage, chemical dissociation and/or chemical addition reactions, so that the chemical structure of the resulting energized neutral species differs from that of the original ionic species. One particular, non-limiting example of a neutralization reaction is shown in EQUATION 1 below:

$$\cdot CF_2^+ + C_2F_6 \leftrightarrows \cdot CF_3 + C_2F_5^+ \quad \text{(EQUATION 1)}$$

In this particular neutralization reaction, which is useful during the deposition phase of a deposition/etch cycle, the collision between an energetic difluoromethylene radical cation and perfluoroethane results in cleavage of a carbon-fluorine bond in perfluoroethane and the accompanying addition of a fluorine radical to the difluoromethylene radical cation, thus resulting in a pentafluorethane cation and an energetic trifluoromethyl radical. The resulting trifluoromethyl radical is a good film-forming agent that can be utilized to form high fluorine content polymeric films on semiconductor substrates.

Another particular, non-limiting example of a neutralization reaction is shown in EQUATION 2 below:

$$Ar^+ + CO_2 \rightarrow CO_2^+ + Ar \quad \text{(EQUATION 2)}$$

In this particular neutralization reaction, which is useful during the etch phase of a deposition/etch cycle, the collision between an argon cation and a carbon dioxide molecule results in charge transfer and the associated generation of energetic argon. The energetic argon may then be used to sputter high fluorine content films formed on a substrate during the deposition cycle (along with the underlying reacted portion of the substrate), thereby etching the substrate.

A variety of gases or combinations of gases may be utilized in the neutralization chamber. Preferably, the gas or gasses chosen are capable of generating energized neutral species with sufficient efficiency so as to allow the neutralization chamber to be of reasonable dimensions. In particular, if the reaction that generates the energized (or hot) neutral species is too slow, a substantial portion of ions entering the neutralization chamber will pass through the chamber without reacting. On the other hand, if the reaction is too fast, essentially all of the ions entering the neutralization chamber will react at the entrance to the chamber. This effectively lengthens the average mean free path that the resulting energized neutral species encounter, thus increasing the likelihood that these species will undergo a side reaction that consumes them, such as a radical addition reaction of the type depicted in EQUATION 3 below:

$$2A \cdot \leftrightarrows A_2 \quad \text{(EQUATION 3)}$$

Ideally, the choice of neutral species and reaction conditions will be such that the mean free path is on the order of a few centimeters. A number of factors affect the mean free path, including, for example, the reaction rate of the reaction that generates energized neutral species, the gas pressure within the neutralization chamber, and the dimensions of that chamber. One skilled in the art will appreciate that these factors may be manipulated to control the effective mean free path. TABLE 1 below gives some examples of reactions that may be used to generate energized neutral species, the associated reaction rates, and the mean free paths (calculated at 15 mTorr and 300°K) associated with them. The first reaction is a passivation chemistry useful during the deposition phase of the deposition/etch cycle, while the remaining reactions are etching chemistries useful during the etch phase of the deposition/etch cycle.

TABLE 1

Mean Free Paths of Energetic Neutral Species

| Reaction | Reaction Rate ($10^{-15}$ m$^3$/s) | Mean Free Path (cm) |
|---|---|---|
| $CF_2^+ + C_2F_6 \rightarrow C_2F_5^+ + CF_3$ | 0.95 | 1.90 |
| $Ar^+ + CO_2 \rightarrow CO_2^+ + Ar$ | 0.48 | 4.25 |
| $Ar^+ + NH_3 \rightarrow NH_3^+ + Ar$ | 1.60 | 1.25 |
| $Ar^+ + SO_2 \rightarrow SO_2^+ + Ar$ | 0.52 | 3.90 |

While the use of neutral gas species in the neutralization chamber is preferred, one skilled in the art will appreciate that it may be possible to use other methods to generate neutral energetic species in accordance with the teachings herein. For example, in some embodiments, ions entering the neutralization chamber could be impinged with an electron beam of appropriate energy, thereby generating energized neutral species. In such an embodiment, it may be necessary to constrict the width of the neutralization chamber in the vicinity of the beam to minimize attenuation of the beam across its width.

It may also be possible in some embodiments to generate energized neutral species by inducing (e.g., through photolysis and/or through the use of a suitable energy source) a dissociation reaction in an ion species that generates a second ion species and a neutral species. The second ion species can then be removed through the use of a suitable electric field and/or a chemical reaction designed to consume the second ion species. One particular, non-limiting example of such a reaction is depicted in EQUATION 4 below:

$$\cdot C_2F_5^+ \leftrightarrows \cdot CF_3 + CF_2^+ \quad \text{(EQUATION 4)}$$

It may further be possible to generate energetic neutral species by causing energized ions to impinge multiple times on the sides of a passageway. Such a passageway could be, for example, the openings or perforations in a grid electrode, or the sides of a trench. However, this approach is less desirable in that it does not, by itself, afford the same control over the energy profile of the generated species as is provided by the device depicted in FIG. 2. One skilled in the art will also appreciate that, while the plasma chamber 203 of FIG. 2 is depicted as being adjacent to the neutralization chamber 205, a remote source of ions could be utilized instead, and various types of conduits may be employed to conduct the ions from the remote source to the neutralization chamber 205. It will also be appreciated that neutral radicals may be formed remotely from the substrate to be treated.

Figure 3:
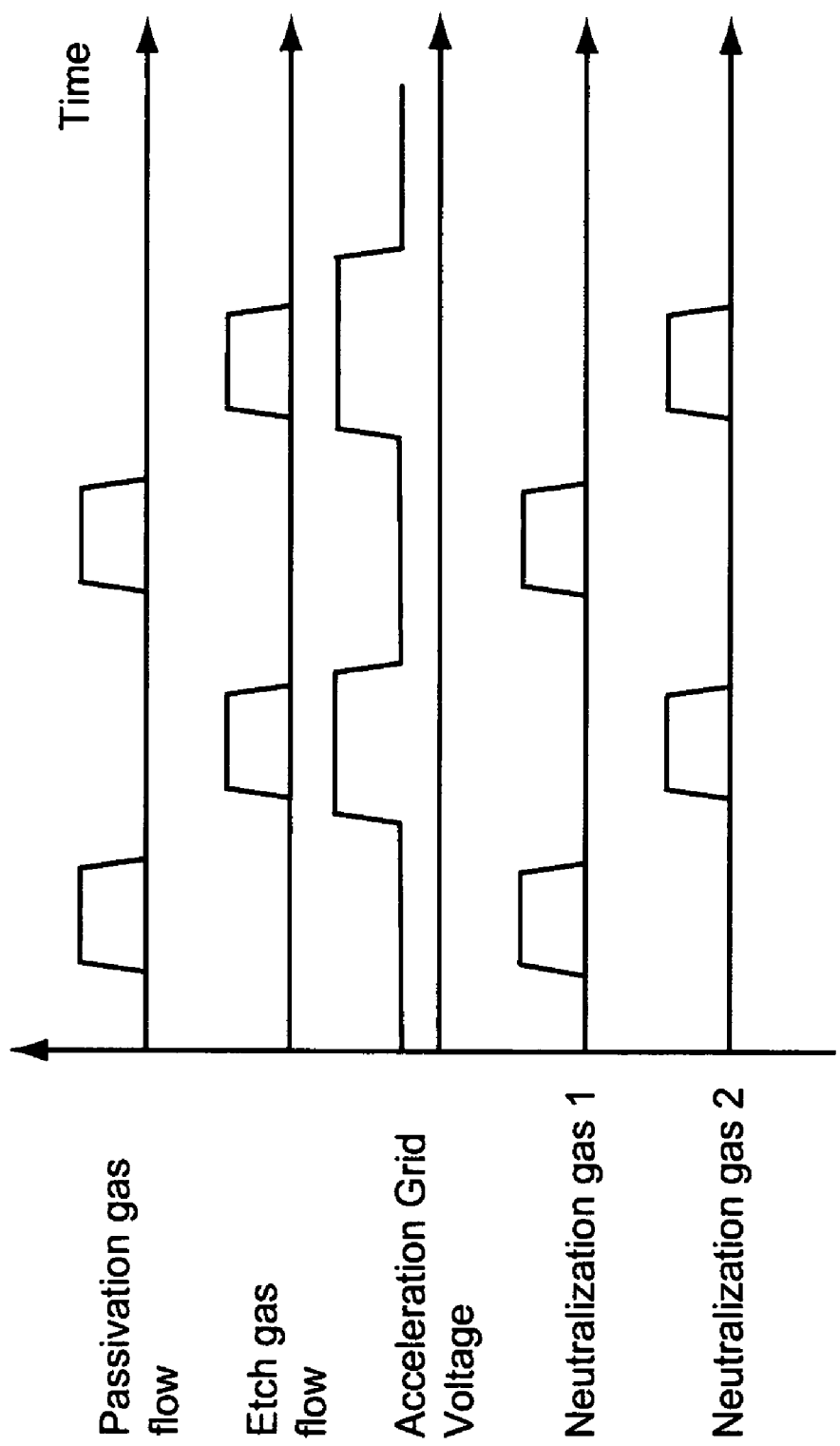
FIG. 3 is a graph of gas flow and acceleration grid voltage as a function of time for an embodiment of an etching method disclosed herein.

As noted above, the preferred embodiment of the etching process described herein is preferably a two-step or two-phase process. The first two cycles of these steps or phases are illustrated in FIG. 3. As seen therein, in the first step, a fluorocarbon passivation film is deposited on the substrate. During this step, a suitable passivation gas such as $C_2F_4$ or $C_4F_8$ is allowed to flow through the plasma chamber, and a suitable neutralization gas such as $C_2F_6$ is allowed to flow through the neutralization chamber. The passivation gas is preferably selected such that, in the plasma chamber, it dissociates into charged $CF_2$ radicals (more specifically, $CF_2^+$ radical cations). $C_2F_4$ and $C_4F_8$ are particularly suitable for this purpose in that they can be readily made to undergo preferential cleavage at the carbon-carbon bond of the alkane backbone, thus generating $CF_2$ radicals as the predominant species. $C_2F_6$ works well as the neutralization gas when used in conjunction with $C_2F_4$ or $C_4F8$ passivation gases since, as seen in EQUATION 1, it reacts readily with $CF_2^+$ radical cations to generate the desired $CF_3$ neutral radicals.

As seen in FIG. 3, the acceleration voltage is preferably small during deposition of the passivation film, since it is desired that the neutral radicals generated are low energy radicals. Indeed, in some circumstances, it may be desirable to utilize a negative acceleration voltage to reduce the mean velocity of the neutral radicals. Various measures may also be employed to manipulate the energy profile of the neutral radicals generated as, for example, by tightening the distribution of the profile around a desired mean energy.

Figure 4:
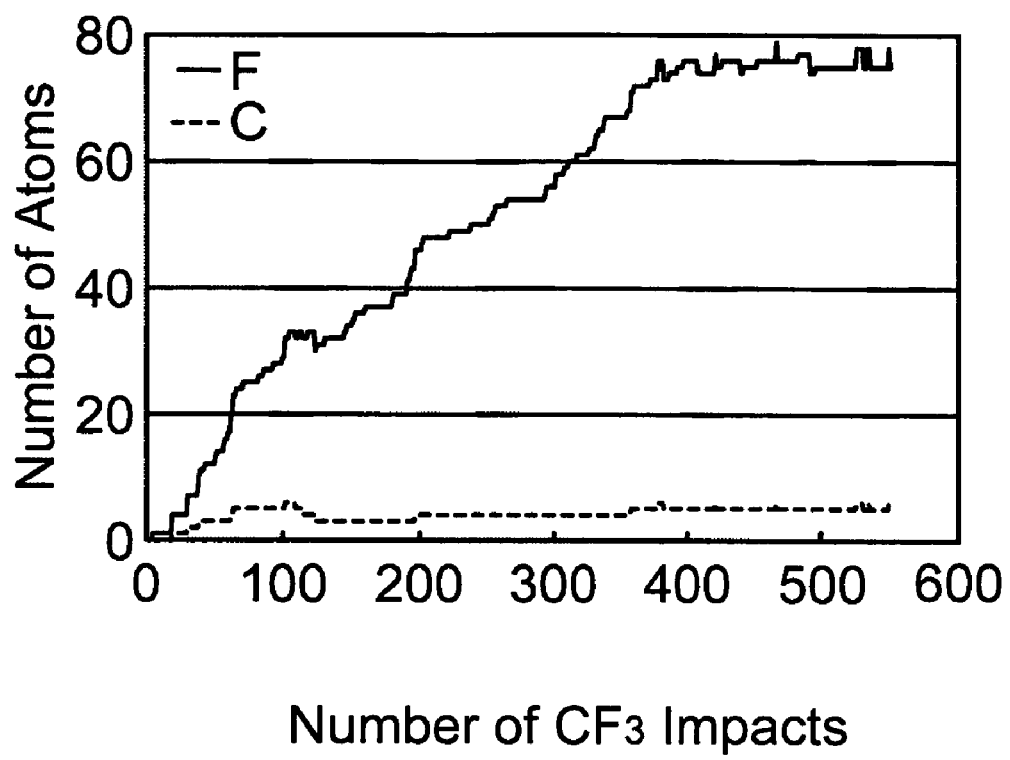
FIG. 4 is a graph of number of atoms deposited as a function of the number of impacts for an etching process in accordance with the teachings herein.

Typically, the deposition of the passivation layer is a self-limiting process, in that the thickness of the film approaches a constant due to saturation of the substrate surface with fluorine. This fact can be appreciated from FIG. 4, which illustrates the number of atoms of carbon and fluorine present on the substrate surface as a function of the number of impacts of the neutral species utilized to form the passivation film. As seen therein, in the case of the deposition of a fluorocarbon passivation layer on an $SiO_2$ substrate by $CF_3$ radicals energized to 20 eV, this constant, which is typically about 5 Å, is achieved after about 350 impacts. A thicker passivation film may be obtained through deposition processes using other species, such as $CF_2$ radicals. Also, the chemistry of the film may be manipulated somewhat by adjusting the ion energy level. Thus, for example, if lower energies (e.g., less than 20 eV) are utilized, the passivation film will typically have a higher carbon content.

The thickness of the passivation film is significant in that it ultimately determines the fluorine content available on the surface of the substrate. This, in turn, determines how much of the substrate will be etched away in the subsequent etch step since, when etching is conducted using neutral species at suitable energy levels, etching will only continue while there is fluorine content available at the surface of the substrate. Consequently, it is typically the case that the etch rate will be faster when a thicker passivation layer is utilized. However, this is typically accompanied by some reduction in accuracy of the etch. Consequently, the thickness of the film may be chosen to strike a desired balance between the speed and the accuracy of the etch.

Figure 5:
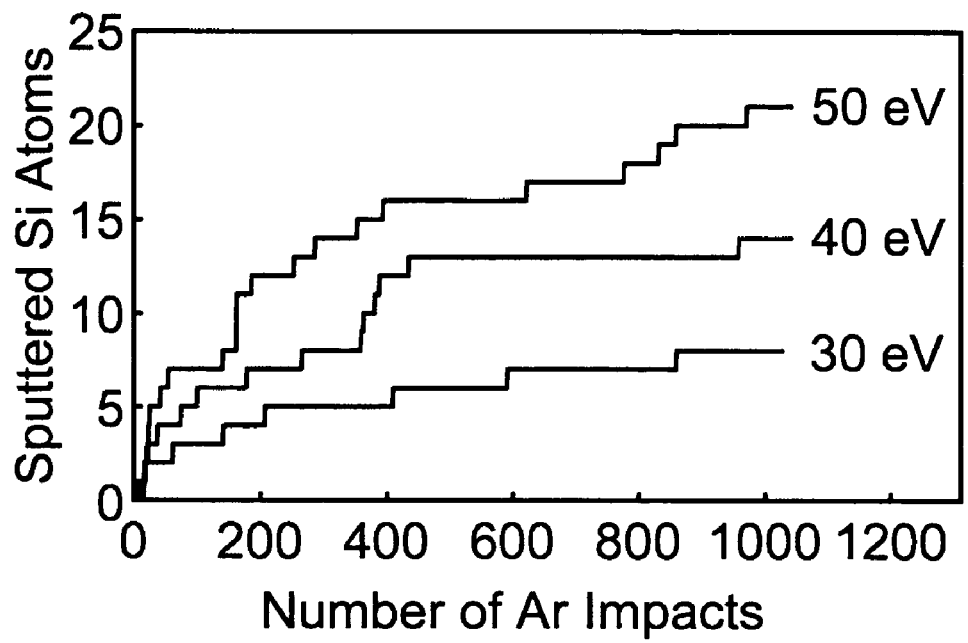
FIG. 5 is a graph of number of the number of Si atoms sputtered as a function of the number of Ar impacts for an etching process in accordance with the teachings herein.
Figure 6:
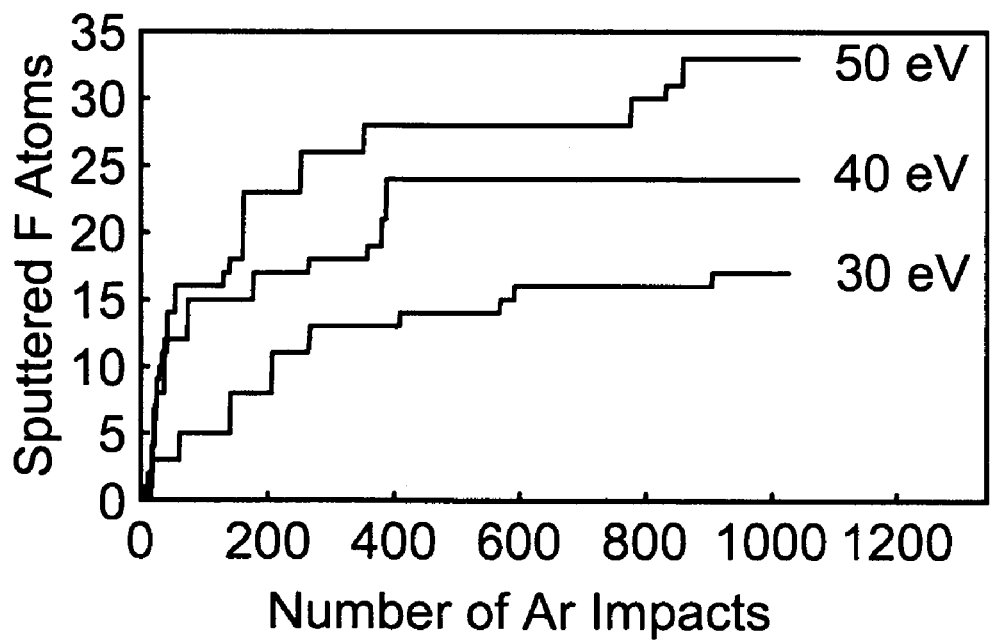
FIG. 6 is a graph of number of the number of F atoms sputtered as a function of the number of Ar impacts for an etching process in accordance with the teachings herein.

Referring again to FIG. 3, after the deposition step is completed, the etch step commences. During this step, the gas flow in the plasma chamber is pulsed to an inert gas such as argon, neon, xenon, krypton or helium, and the neutralization gas in the neutralization chamber is pulsed to $CO_2$, $SO_2$, $NH_3$ or the like. The acceleration voltage is also increased, with the amount of increase depending on such factors as the desired etch rate and surface roughness. This may be appreciated from the graphs in FIGS. 5 and 6, which depict the number of sputtered Si and F atoms, respectively, as a function of the number of Ar atom impacts. As seen therein, increasing the acceleration voltage has the effect of increasing the etch rate by increasing the number of Si and F atoms that are sputtered away for a given number of Ar atom impacts. Typically, a faster etch rate is accompanied by an increase in surface roughness. Hence, as with film thickness, the acceleration energy may be chosen to strike a desired balance between etch speed and the degree of surface roughness (and therefore the accuracy) associated with the etch.

The mean energy of the etching radicals utilized in the etch cycle is typically chosen to be sufficiently high such that the etching radicals will effectively sputter the passivation film and the portion of the substrate that has reacted with it. However, the average energy of the etching radicals is also typically chosen to be sufficiently below the threshold for substrate (e.g., $SiO_2$) sputtering so that the etch cycle will be essentially self-limiting (e.g., so that etching will essentially terminate when there is no fluorine content available). In the case of $SiO_2$ substrates etched with Ar radicals, it is found that the self-limiting nature of the etch typically decreases after about 50 eV. Beyond that energy threshold, the $SiO_2$ substrate is found to continue to etch even after all of the fluorine content at the substrate surface is exhausted, due to sputtering of the substrate by the Ar radicals.

A number of variations are possible in the process depicted in FIG. 3. For example, while the profile depicted in FIG. 3 is preferred, in some embodiments, rather than utilizing a step function in the gas flow and acceleration grid voltage profiles, other profiles could be utilized, with the profile possibly being tailored to the specific application. For example, appropriate circuitry can be utilized such that the acceleration grid voltage is underdamped at the beginning of the etch step and is then allowed to relax to some steady state so as to eliminate any spiking that might occur as a result of fluctuations in the power supply. Also, a flow of another gas species, such as oxygen, could be introduced near the end of the etch step to remove residual carbon content.

A process has been disclosed herein that utilizes energetic neutral molecular species, such as neutral radical molecular species, in a step-by-step plasma etch process. The process affords greater precision than conventional plasma etch processes, and greater speed than conventional atomic layer etching processes.

The above description of the present invention is illustrative, and is not intended to be limiting. It will thus be appreciated that various additions, substitutions and modifications may be made to the above described embodiments without departing from the scope of the present invention. Accordingly, the scope of the present invention should be construed in reference to the appended claims.

What is claimed is:

1. A method for etching a material, comprising:
   forming a film on a material by impinging the material with a first neutral molecular species created through a charge exchange reaction between a third charged species and a fourth neutral species; and
   etching the material by impinging the film with a second species;
   wherein the method further comprises:
   providing a first chamber equipped with a first gas supply and a second chamber, equipped with a second gas supply, which is in communication with the first chamber by way of an acceleration grid;
   oscillating the gas flow into the first chamber between a first state in which the gas flow into the first chamber has the composition $f_{11}$ and the gas flow into the second chamber has the composition $f_{21}$, and a second state in which the gas flow into the first chamber has the composition $f_{12}$ and the gas flow into the second chamber has the composition $f_{22}$; and
   oscillating the potential applied to the acceleration grid such that the voltage applied to the grid is $V_1$ when the gas flow into the first chamber is in the first state, and the voltage applied to the grid is $V_2$ when the gas flow into the first chamber is in the second state.

2. The method of claim 1, wherein the first chamber is a plasma chamber and the second chamber is a neutralization chamber.

3. The method of claim 1, wherein the acceleration grid has a variable potential.

4. The method of claim 1, wherein the third charged species is created in the first chamber.

5. The method of claim 1, wherein the charge exchange reaction occurs in the second chamber.

6. The method of claim 1, wherein the third charged species has higher average kinetic energy than the fourth neutral species.

7. The method of claim 1, wherein the first neutral molecular species is created by causing a third charged species to impinge multiple times on the sufaces of a passageway.

8. The method of claim 1, wherein the first neutral molecular species is created through a photolyrically induced reaction.

9. The method of claim 1, wherein the first neutral molecular species is selected from the group consisting of $CF_3$, $CF_2$, and CF radicals.

10. The method of claim 1, wherein the second species is a neutral species selected from the group consisting of argon, helium, krypton, neon, xenon.

11. A method for etching a substrate, comprising:
providing a plasma chamber equipped with a first gas supply;
providing a neutralization chamber, equipped with a second gas supply, which is in communication with the plasma chamber by way of an acceleration grid;
oscillating the gas flow into the plasma chamber and neutralization chamber between a first state in which the gas flow into the plasma chamber has the composition $f_{11}$ and the gas flow into the neutralization chamber has the composition $f_{21}$, and a second state in which the gas flow into the plasma chamber has the composition $f_{12}$ and the gas flow into the neutralization chamber has the composition $f_{22}$; and
oscillating the potential applied to the acceleration grid such that the voltage applied to the grid is $V_1$ when the gas flow into the plasma chamber is in the first state, and the voltage applied to the grid is $V_2$ when the gas flow into the plasma chamber is in the second state.

12. The method of claim 11, wherein the second gas supply includes first and second neutralization gases, wherein the first neutralization gas is a fluorocarbon, and wherein the second neutralization gas is selected from the group consisting of $CO_2$, $SO_2$ and $NH_3$.

13. The method of claim 11, wherein the first gas supply includes a passivation gas and an etch gas, wherein the flow rate of passivation gas is w, wherein the flow rate of etch gas is x, wherein $f_{11}(w, x)=f_{11}(w, 0)$, and wherein $f_{12}(w, x)=f_{12}(0, x)$.

14. The method of claim 13, wherein the passivation gas is a fluorocarbon, and wherein the etch gas is selected from the group consisting of argon, helium, krypton, neon, and xenon.

15. The method of claim 14, wherein the passivation gas is selected from the group consisting of $C_2F_4$ and $C_4F_8$.

16. The method of claim 1, wherein the third charged species is a fluorocarbon radical cation, and wherein the fourth neutral species is a fluorocarbon.

17. The method of claim 16, wherein the third charged species is selected from the group consisting of difluoromethylene radical cations and trifluoromethyl radical cations, and wherein the fourth neutral species is $C_2F_6$.

* * * * *